United States Patent
Lu

(10) Patent No.: US 9,515,103 B2
(45) Date of Patent: Dec. 6, 2016

(54) LTPS TFT SUBSTRATE STRUCTURE AND METHOD OF FORMING THE SAME

(71) Applicant: Shenzhen China Star Optoelectronics Technology Co., Ltd., Shenzhen, Guangdong (CN)

(72) Inventor: Gaiping Lu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/428,983

(22) PCT Filed: Feb. 9, 2015

(86) PCT No.: PCT/CN2015/072558
§ 371 (c)(1),
(2) Date: Mar. 18, 2015

(87) PCT Pub. No.: WO2016/101401
PCT Pub. Date: Jun. 30, 2016

(65) Prior Publication Data
US 2016/0233249 A1    Aug. 11, 2016

(30) Foreign Application Priority Data
Dec. 24, 2014 (CN) .......................... 2014 1 0817492

(51) Int. Cl.
*H01L 27/12* (2006.01)
*H01L 29/786* (2006.01)
*H01L 29/49* (2006.01)

(52) U.S. Cl.
CPC ....... *H01L 27/1281* (2013.01); *H01L 27/1222* (2013.01); *H01L 27/1251* (2013.01); *H01L 27/1274* (2013.01); *H01L 27/1285* (2013.01); *H01L 29/4908* (2013.01); *H01L 29/78621* (2013.01); *H01L 29/78675* (2013.01)

(58) Field of Classification Search
CPC .................... H01L 27/1274; H01L 27/1281
See application file for complete search history.

(56) References Cited

U.S. PATENT DOCUMENTS

2004/0197968 A1* 10/2004 Peng ................. H01L 27/12
  438/154
2007/0262311 A1* 11/2007 Liu .................. H01L 29/04
  257/66

* cited by examiner

*Primary Examiner* — Ha Tran T Nguyen
*Assistant Examiner* — Aaron Dehne
(74) *Attorney, Agent, or Firm* — Andrew C. Cheng

(57) ABSTRACT

A method of forming an LTPS TFT substrate includes: Step 1: providing a substrate (1) and depositing a buffer layer (2); Step 2: depositing an a-Si layer (3); Step 3: depositing and patterning a silicon oxide layer (4); Step 4: taking the silicon oxide layer (4) as a photomask and annealing the a-Si layer (3) with excimer laser, so that the a-Si layer crystallizes and turns into a poly-Si layer; Step 5: forming a first poly-Si region (31) and a second poly-Si region (32); Step 6: defining a heavily N-doped area and a lightly N-doped area on the first and second poly-Si regions (31) and (32), and forming an LDD area; Step 7: depositing and patterning a gate insulating layer (5); Step 8: forming a first gate (61) and a second gate (62); Step 9: forming via holes (70); and Step 10: forming a first source/drain (81) and a second source/drain (82).

6 Claims, 6 Drawing Sheets

LTPS TFT SUBSTRATE STRUCTURE AND METHOD OF FORMING THE SAME

BACKGROUND OF THE INVENTION

1. Field of the Invention

The present invention relates to display technology, and more specifically, to a low temperature poly-silicon (LTPS) thin-film transistor (TFT) substrate structure and a method of forming the same.

2. Description of the Prior Art

Thin-film transistor liquid crystal display (TFT-LCD) can be achieved by two approaches: polycrystalline silicon (poly-Si) and amorphous silicon (a-Si). Low temperature poly-silicon (LTPS) is the latest generation of TFT-LCD producing technology. The biggest difference between a LTPS TFT-LCD and a conventional a-Si TFT-LCD is that the former responds faster, has higher brightness and resolution, and consumes less power.

The crystalline silicons used by LTPS technology are arrayed more orderly than that used by a-Si technology. Therefore, the electron mobility of LTPS technology is over 100 times higher than that of a-Si technology. The peripheral driver can be built on the same glass substrate, saving space and the cost of driver integrated circuit (IC). Because the driver IC is directly built on the substrate, it reduces the number of external contact points, increases reliability, simplifies maintenance procedure, shortens assembly time, and lowers electromagnetic interference, which shortens the time needed for application system design, and renders more flexibility in design.

FIG. 1 is a diagram of a conventional LTPS TFT substrate. The forming method generally comprises the following steps:

Step 1: Provide a substrate 100 and deposit a buffer layer 200;

Step 2: Deposit an a-Si layer on the buffer layer 200;

Step 3: Anneal the a-Si layer with excimer laser, so that the a-Si layer is turned into a poly-Si layer.

Step 4: Pattern the poly-Si layer through lithography and etching process so to form a first poly-Si region 310 and a second poly-Si region 320. These two regions are arrayed with a space in between.

Step 5: Define a heavily N-doped area and lightly N-doped area on the first poly-Si region 310 and the second poly-Si region 320 respectively. Implant different dosages of P31 in the heavily N-doped area and lightly N-doped area so to form lightly doped drain (LDD) areas.

Step 6: Deposit and pattern a gate insulating layer 500 on the buffer layer 2, the first poly-Si region 310 and the second poly-Si region 320.

Step 7: Deposit and pattern a first metal layer on the gate insulating layer 500 corresponding to the first poly-Si region 310 and the second poly-Si region 320 to form a first gate 610 and a second gate 620.

Step 8: Form an interlayer dielectric (ILD) layer 700 on the gate insulating layer 500. Form via holes 701 leading to the heavily N-doped areas next to the first poly-Si region 310 and the second poly-Si region 320 through the gate insulating layer 500 and the interlayer dielectric layer 700.

Step 9: Deposit and pattern a second metal layer on top of the interlayer dielectric layer 700 to form a first source/drain 810 and a second source/drain 820.

The first source/drain 810 and the second source/drain 820 are in contact with the heavily N-doped areas next to the first poly-Si region 310 and the second poly-Si region 320 through the via holes 701. And then, a complete LTPS TFT substrate is formed through subsequent standard procedure.

A LTPS TFT substrate comprises a display area, and a drive area located in a non-display area. The conventional forming method of the LTPS TFTs results in poorer uniformity in the display area, and lower-than-expected electron mobility of the driver in the drive area, further affecting the quality of LTPS TFT substrates.

SUMMARY OF THE INVENTION

An object of the present invention is to provide a method of forming a LTPS TFT substrate that has relatively larger poly-Si dies and attains to higher electron mobility in the drive area, so to elevate the electrical characteristics of the driver. On the other hand, it has relatively smaller poly-Si dies with better uniformity in the display area, so that the electrical property of the TFT within the display area can be more even, and the quality of the LTPS TFT substrate is improved.

Another object of the present invention is to provide a LTPS TFT substrate structure with its poly-Si region in the drive area producing larger poly-Si dies and poly-Si region in the display area producing smaller poly-Si dies with better uniformity. Thus the drive has better electrical characteristics, and the TFT in the display area has more uniformed electrical property, so that the TFT substrate will have higher quality.

According to the present invention, a method of forming a low temperature poly-Si (LTPS) thin-film transistor (TFT) substrate, comprises:

Step 1: providing a substrate and depositing a buffer layer on the substrate;

Step 2: depositing and patterning an a-Si layer on the buffer layer, so to get a first a-Si region in the display area and a second a-Si region in the drive area, with the two regions arrayed with a space in between;

Step 3: depositing a silicon oxide layer on the first a-Si region and the second a-Si region, and patterning the silicon oxide layer through lithography and etching process, so to form a silicon oxide layer in the display area;

Step 4: taking the silicon oxide layer as a photomask and annealing the first a-Si region and the second a-Si region with excimer laser, so that they crystallize and turn into poly-Si regions;

Step 5: removing the silicon oxide layer and forming the first poly-Si region in the display area and the second poly-Si region in the drive area, with the two regions arrayed with a space in between;

Step 6: defining a heavily N-doped area and a lightly N-doped area on the first and second poly-Si regions respectively, and implanting different dosages of P31 into the heavily N-doped area and the lightly N-doped area, so to form a lightly doped drain (LDD) area;

Step 7: depositing and patterning a gate insulating layer on the buffer layer, the first and the second poly-Si regions;

Step 8: depositing a first metal layer on the gate insulating layer, and patterning the metal layer to form a first gate and a second gate corresponding to the first and the second poly-Si regions respectively;

Step 9: forming an interlayer dielectric layer on the gate insulating layer, and forming via holes leading to the heavily N-doped areas next to the first and second poly-Si regions through the gate insulating layer and the interlayer dielectric layer;

Step 10: depositing and patterning a second metal layer on the interlayer dielectric layer, and forming a first source/ drain and a second source/drain, with the first source/drain and the second source/drain connecting to the heavily N-doped areas next to the first and second poly-Si regions through the via hole.

Furthermore, materials of the buffer layer are either silicon nitride, silicon oxide, or the combination of both.

Furthermore, materials of the interlayer dielectric layer are either silicon oxide, silicon nitride, or the combination of both.

Furthermore, each of the first gate and the second gate is a single layer or stacked layers, and each layer is made of a material selected from molybdenum, titanium, aluminum, or copper.

Furthermore, in the Step 6, the heavily N-doped area and the lightly N-doped area are defined by applying lithographic photoresist and two photomasks respectively, and lightly doped drain areas are produced by implanting different dosages of P31 in the heavily N-doped area and lightly N-doped area.

Furthermore, the gate insulating layer, the first gate, the second gate, the via hole, the first source/drain and the second source/drain are formed through deposition, lithography and etching process.

According to the present invention, an LTPS TFT substrate comprises a substrate, a buffer layer on the substrate, a first poly-Si region and a second poly-Si region arrayed on the buffer layer with a space between the two regions, a first source/drain and a second source/drain disposed above the first poly-Si region and the second poly-Si region, a gate insulating layer installed on the buffer layer, the first poly-Si region and second poly-Si region, a first gate and a second gate installed on the gate insulating layer corresponding to the first poly-Si region and second poly-Si region, an interlayer dielectric layer installed on the gate insulating layer, the first gate and the second gate, wherein both sides of the first poly-Si region and the second poly-Si region are next to a heavily N-doped area, which connects to the first source/drain and the second source/drain through the via hole.

The LTPS TFT substrate further comprises a display area and a drive area, with the first poly-Si region in the display area of the LTPS TFT substrate, and the second poly-Si region in the drive area of the LTPS TFT substrate; the dies of the first poly-Si region is smaller than that of the second poly-Si region, while the uniformity of the dies of the first poly-Si region is larger than that of the second poly-Si region.

Furthermore, materials of the buffer layer are either silicon nitride, silicon oxide, or a combination of both;

Furthermore, materials of the interlayer dielectric layer are silicon oxide, silicon nitride, or a combination of both;

Furthermore, each of the first gate and the second gate is a single layer or stacked layers, and each layer is made of a material selected from molybdenum, titanium, aluminum, or copper.

According the present invention, an LTPS TFT substrate comprises a substrate, a buffer layer on the substrate, a first poly-Si region and a second poly-Si region arrayed on the buffer layer with a space between the two regions, a first source/drain and a second source/drain disposed above the first poly-Si region and the second poly-Si region, a gate insulating layer installed on the buffer layer, the first poly-Si region and second poly-Si region, a first gate and a second gate installed on the gate insulating layer corresponding to the first poly-Si region and second poly-Si region, an interlayer dielectric layer installed on the gate insulating layer, the first gate and the second gate, wherein both sides of the first poly-Si region and the second poly-Si region are next to a heavily N-doped area, which connects to the first source/drain and the second source/drain through the via hole;

the LTPS TFT substrate further comprises a display area and a drive area, with the first poly-Si region in the display area of the LTPS TFT substrate, and the second poly-Si region in the drive area of the LTPS TFT substrate; the dies of the first poly-Si region is smaller than that of the second poly-Si region, while the uniformity of the dies of the first poly-Si region is larger than that of the second poly-Si region;

wherein materials of the buffer layer are either silicon nitride, silicon oxide, or a combination of both;

wherein materials of the interlayer dielectric layer are silicon oxide, silicon nitride, or a combination of both;

wherein each of the first gate and the second gate is a single layer or stacked layers, and each layer is made of a material selected from molybdenum, titanium, aluminum, or copper.

The present invention brings several benefits. The forming method of the LTPS TFT substrate of the present invention first defines the pattern of an a-Si layer with a photomask, expanding the chilled zone for crystallization so that the crystallization starts along the edge of the pattern and moves to the center of the pattern. Then, deposit and pattern a film of silicon oxide on the a-Si layer to produce a layer of silicon oxide on the a-Si layer in the display area. The silicon oxide layer serves as a photomask when the a-Si layer is annealed by excimer laser and crystallizes, and turns into a poly-Si layer. It forms relatively larger dies in the drive area and attains to higher electron mobility. The display area, because of the shielding of the silicon oxide layer, is exposed to lower laser energy, thus forms relatively smaller dies with better uniformity. It ensures a more even electron mobility in the display area and enhances the quality of the LTPS TFT substrate. The forming process is simple and easy to operate. In addition, the present invention provides a LTPS TFT substrate structure with the poly-Si region in the drive area producing larger dies, and the poly-Si region in the display area producing smaller dies with better uniformity, so to ensure that the drive has better electrical characteristics and the TFT within the display area has more even electrical property. The TFT substrate, therefore, has better quality.

BRIEF DESCRIPTION OF THE DRAWINGS

The accompanying drawings are included to provide a further understanding of the invention, and are incorporated in and constitute a part of this specification.

DETAILED DESCRIPTION OF PREFERRED EMBODIMENTS

The drawings illustrate embodiments of the invention and, together with the description, serve to explain the principles of the invention.

Figure 1:
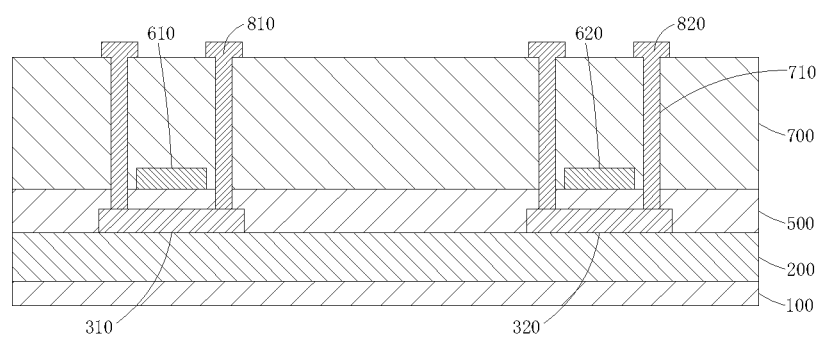
FIG. 1 shows a structure diagram of a conventional LTPS TFT substrate.
Figure 2:
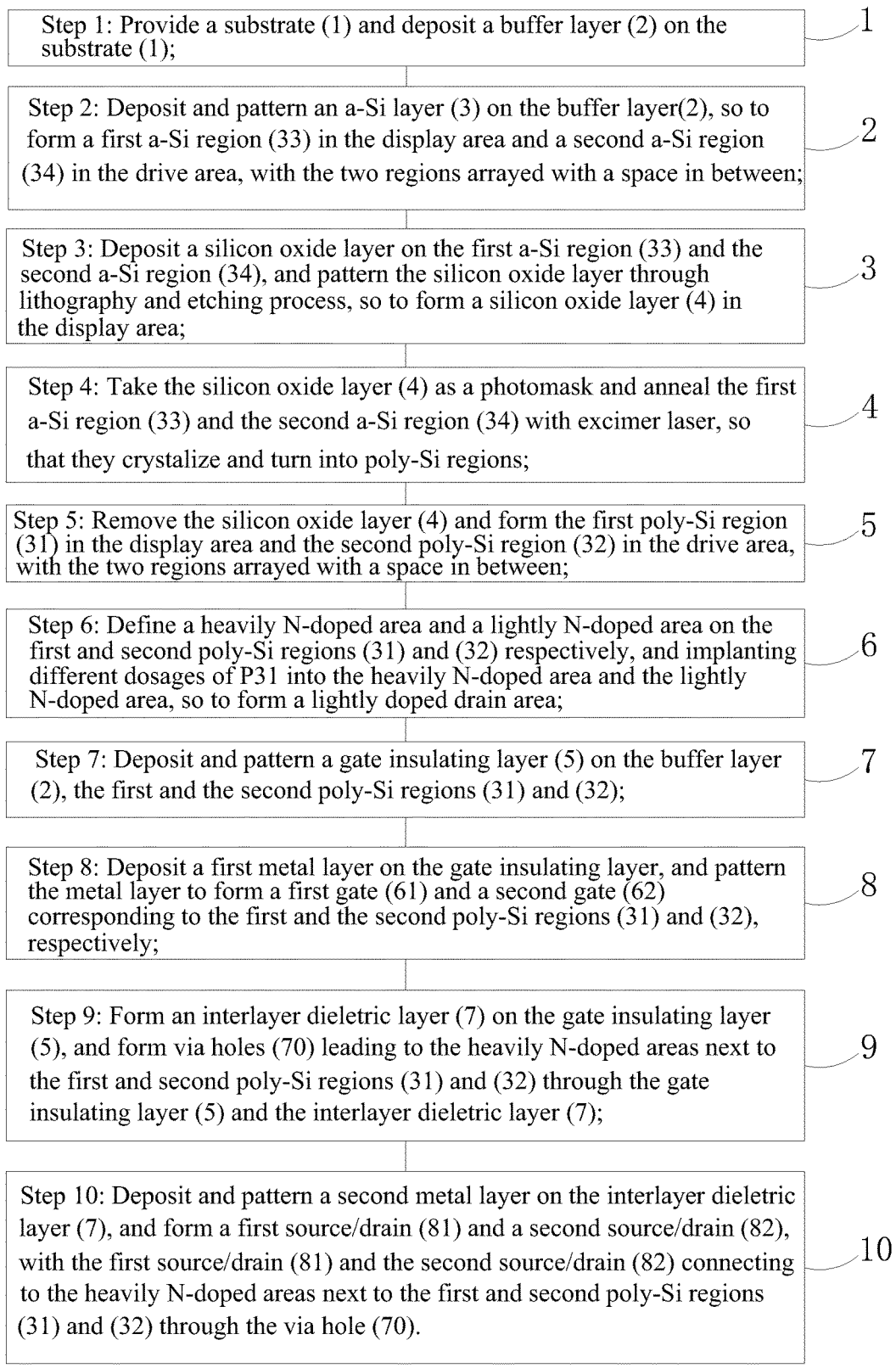
FIG. 2 shows a flowchart of a method for forming a LTPS TFT substrate according to a preferred embodiment of the present invention.
Figure 3:
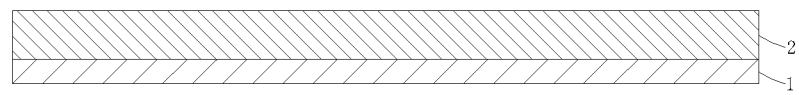
FIG. 3 shows a diagram of a step 1 of the method for forming the LTPS TFT substrate as depicted in FIG. 2.

Please refer to FIG. 1. The present invention provides a method of forming a LTPS TFT substrate comprising the following steps:

Step 1: Provide a substrate 1, and deposit a buffer layer 2 on the substrate 1, as shown in FIG. 3.

The substrate 1 is a transparent substrate which is made, preferably, of glass or plastic.

Specifically, the materials of the buffer layer 2 can be either silicon nitride (SiNx), silicon oxide (SiOx), or the combination of the two.

Figure 4:
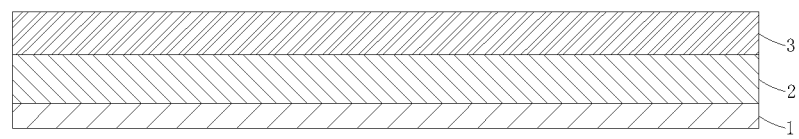
FIGS. 4-5 show a diagram of a step 2 of the method for forming the LTPS TFT substrate as depicted in FIG. 2.
Figure 5:
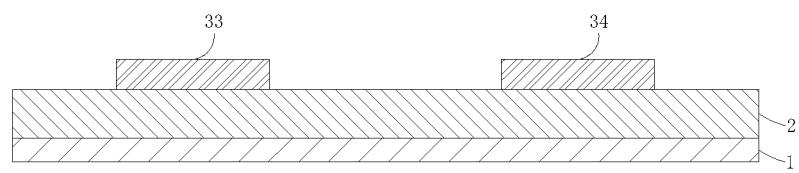

Step 2: As shown in FIGS. 4 and 5, deposit and pattern a first a-Si layer 3 on the buffer layer 2 to get a first a-Si region 33 in the display area and a second a-Si region 34 in the drive area. The two regions are arrayed with a space in between.

The step defines the pattern of the a-Si layer 3 with a photomask and etching, expanding the chilled zone for crystallization so that the crystallization starts along the edge of the pattern and moves to the center of the pattern, resulting in better crystallization effect.

Figure 6:
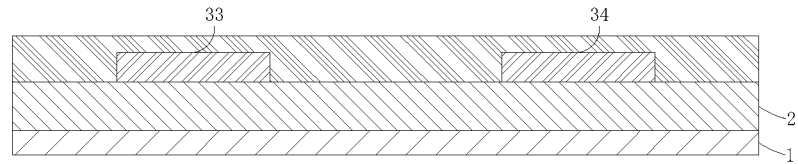
FIG. 6-7 show a diagram of a step 3 of the method for forming the LTPS TFT substrate as depicted in FIG. 2.
Figure 7:
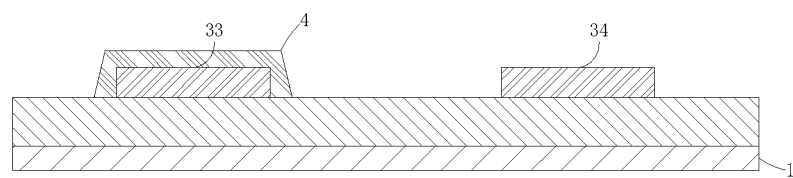

Step 3: As shown in FIGS. 6 and 7, deposit a silicon oxide layer on the first a-Si region 33 and the second a-Si region 34, and pattern the silicon oxide layer through lithography and etching process so to get a silicon oxide layer 4 in the display area.

The second a-Si region 34 in the drive area of the non-display area, at this stage, is not covered by the silicon oxide layer 4.

Figure 8:
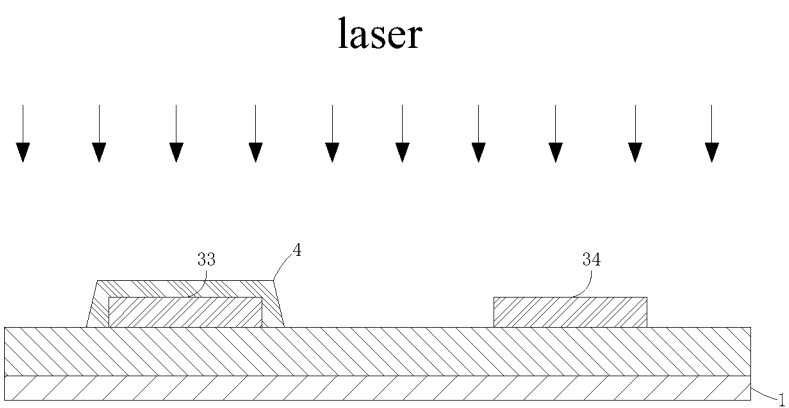
FIG. 8 show a diagram of a step 4 of the method for forming the LTPS TFT substrate as depicted in FIG. 2.

Step 4: As shown in FIG. 8, the silicon oxide layer 4 is taken as a photomask when the first a-Si region 33 and the second a-Si region 34 are annealed by excimer laser. The two a-Si regions 33 and 34 thus crystallize and turn into poly-Si regions.

When the first a-Si region 33 and the second a-Si region 34 are annealed by excimer laser, as the first a-Si region 33 is covered by the silicon oxide layer 4, it is exposed to relatively lower laser energy and forms smaller dies. The second a-Si region 34 in the drive area is not covered by the silicon oxide layer 4, therefore it is exposed to higher laser energy and forms relatively larger dies.

Figure 9:
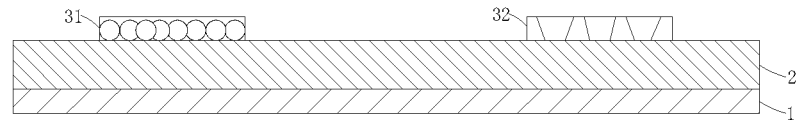
FIG. 9 shows a diagram of a step 5 of the method for forming the LTPS TFT substrate as depicted in FIG. 2.

Step 5: As shown in FIG. 9, after the silicon oxide layer 4 is removed, the first poly-Si region 31 in the display area and the second poly-Si region 32 in the drive area are arrayed with a space in between.

The first poly-Si region 31 in the display area has smaller dies with better uniformity, whereas the second poly-Si region 32 in the drive area has larger dies.

Figure 10:
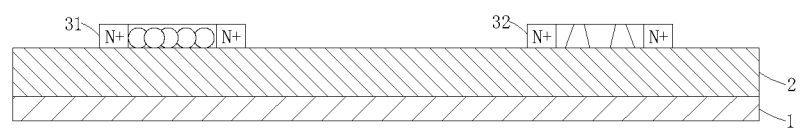
FIG. 10 shows a diagram of a step 6 of the method for forming the LTPS TFT substrate as depicted in FIG. 2.

Step 6: As shown in FIG. 10, a heavily N-doped area and lightly N-doped area are defined respectively on the first poly-Si region 31 and the second poly-Si region 32. Different dosages of P31 (Phosphorus-31) are implanted in the heavily N-doped area and lightly N-doped area respectively to form LDD areas.

Specifically, the heavily N-doped area and the lightly N-doped area are defined by applying lithographic photoresist and two photomasks, respectively. Implant different dosages of P31 (Phosphorus-31) in the heavily N-doped area and lightly N-doped area, so to form LDD areas.

Figure 11:
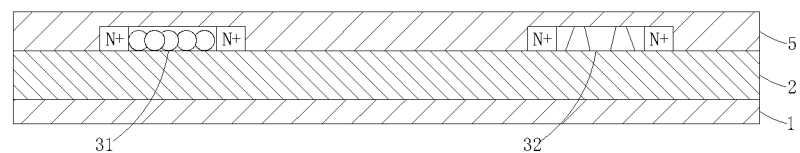
FIG. 11 shows a diagram of a step 7 of the method for forming the LTPS TFT substrate as depicted in FIG. 2.

Step 7: As shown in FIG. 11, deposit and pattern a gate insulating layer 5 on the buffer layer 2, the first poly-Si region 31 and the second poly-Si region 32.

Figure 12:
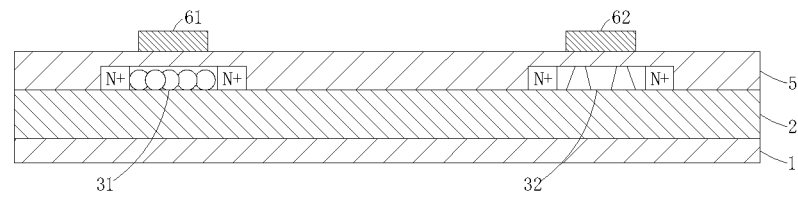
FIG. 12 shows a diagram of a step 8 of the method for forming the LTPS TFT substrate as depicted in FIG. 2.

Step 8: As shown in FIG. 12, deposit and pattern a first metal layer and form a first gate 61 and a second gate 62 on the gate insulating layer 5 corresponding to the first poly-Si region 31 and the second poly-Si region 32.

Specifically, each of the first gate 61 and the second gate 62 is a single layer or stacked layers, and each layer is made of a material selected from molybdenum (Mo), titanium (Ti), aluminum (Al) or copper (Cu).

Figure 13:
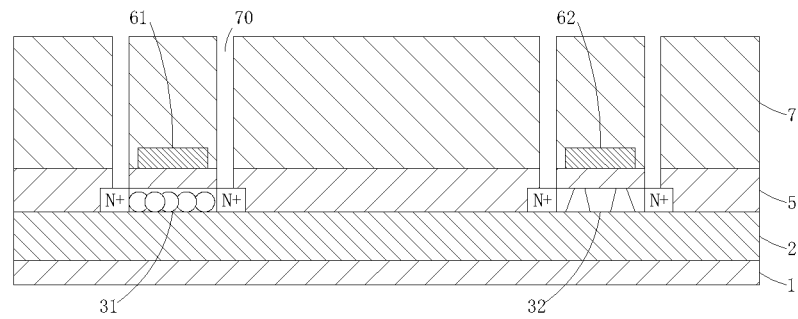
FIG. 13 shows a diagram of a step 9 of the method for forming the LTPS TFT substrate as depicted in FIG. 2.

Step 9: As shown in FIG. 13, form an interlayer dielectric layer 7 on the gate insulating layer 5. Form via holes 70 leading to the heavily N-doped areas next to the first poly-Si region 31 and the second poly-Si region 32 through the gate insulating layer 5 and the interlayer dielectric layer 7.

Specifically, materials of the interlayer dielectric layer 7 can be silicon nitride (SiNx), silicon oxide (SiOx), or a combination of both.

Figure 14:
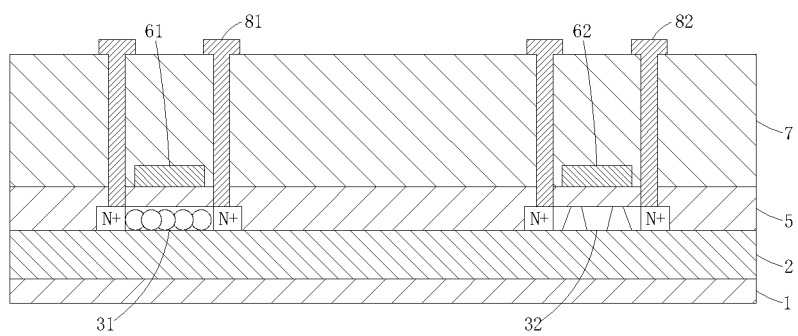
FIG. 14 shows a diagram of a step 10 of the method for forming the LTPS TFT substrate as depicted in FIG. 2, and a cross-sectional view of the LTPS TFT substrate according to the present invention.

Step 10: As shown in FIG. 14, deposit and pattern a second metal layer on the interlayer dielectric layer 7, so to form a first source/drain 81 and a second source/drain 82

The first source/drain 81 and the second source/drain 82 contact the heavily N-doped areas next to the first poly-Si region 31 and the second poly-Si region 32 respectively through the via holes 70. The existing techniques can be applied afterwards so to complete the following procedure, and eventually produce a LTPS TFT substrate.

Specifically, the gate insulating layer 5, the first gate 61, the second gate 62, the via hole 70, and the first source/drain 81 and the second source/drain 82 are formed through deposition, lithography and etching process.

The method of forming the LTPS TFT substrate first defines the pattern of the a-Si layer, expanding the chilled zone for crystallization so that the crystallization starts along the edge of the pattern and moves to the center of the pattern. Then, deposit and pattern a film of silicon oxide on the a-Si layer to produce a layer of silicon oxide on the a-Si layer in the display area. The silicon oxide layer serves as a photomask when the a-Si layer is annealed by excimer laser and crystallizes, and turns into a poly-Si layer. It forms relatively larger dies in the drive area and attains to higher electron mobility. The display area, because of the shielding of the silicon oxide layer, is exposed to lower laser energy, thus forms relatively smaller dies with better uniformity. Therefore, the electron mobility in the display area has better uniformity and thus elevates the quality of the LTPS TFT substrate.

Please refer to FIG. 14. The present invention further provides a LTPS TFT substrate structure, comprising a substrate 1; a buffer layer 2 on the substrate 1; a first poly-Si region 31 and a second poly-Si region 32 arrayed with a space in between on the buffer layer 2; a first source/drain 81 and a second source/drain 82 disposed above the first poly-Si region 31 and second poly-Si region 32; a gate insulating layer 5 installed on the buffer layer 2, the first poly-Si region 31 and second poly-Si region 32; a first gate 61 and a second gate 62 installed on the gate insulating layer 5 corresponding to the first poly-Si region 31 and second poly-Si region 32; and an interlayer dielectric layer 7 installed on the gate insulating layer 5, the first gate 61 and the second gate 62. Both sides of the first poly-Si region 31 and second poly-Si region 32 are next to a heavily N-doped area, which are connected to the first source/drain 81 and the second source/drain 82 through via holes 70.

The LTPS TFT substrate comprises a display area and a drive area. The first poly-Si region 31 is in the display area of the LTPS TFT substrate, and the second poly-Si region 32 is in the drive area of the LTPS TFT substrate. The dies of the first poly-Si region 31 is smaller than that of the second poly-Si region 32, yet the uniformity of the dies of the first poly-Si region 31 is larger than that of the second poly-Si region 32.

A substrate 1 is a transparent substrate which is made, preferably, of glass or plastic.

Specifically, materials of the buffer layer 2 and the interlayer dielectric layer 7 can be either silicon nitride (SiNx), silicon oxide (SiOx), or the combination of the both. Each of the first gate 61 and the second gate 62 is a single layer or stacked layers, and each layer is made of a material selected from molybdenum (Mo), titanium (Ti), aluminum (Al) or copper (Cu).

The dies of the poly-Si region of the present LTPS TFT structure is larger in the drive area, and smaller but has better uniformity in the display area. Therefore the drive has better electrical characteristics, and the TFT within the display area has more even electrical property, so that the TFT substrate has better quality.

In sum, the forming method of the LTPS TFT substrate of the present invention first defines the pattern of an a-Si layer with a photomask, expanding the chilled zone for crystallization so that the crystallization starts along the edge of the pattern and moves to the center of the pattern. Then, deposit and pattern a film of silicon oxide on the a-Si layer to produce a layer of silicon oxide on the a-Si layer in the display area. The silicon oxide layer serves as a photomask when the a-Si layer is annealed by excimer laser and crystallizes, and turns into a poly-Si layer. It forms relatively larger dies in the drive area and attains to higher electron mobility. The display area, because of the shielding of the silicon oxide layer, is exposed to lower laser energy, thus forms relatively smaller dies with better uniformity. It ensures a more even electron mobility in the display area and enhances the quality of the LTPS TFT substrate. The forming process is simple and easy to operate. In addition, the present invention provides a LTPS TFT substrate structure with the poly-Si region in the drive area producing larger dies, and the poly-Si region in the display area producing smaller dies with better uniformity, so to ensure that the drive has better electrical characteristics and the TFT within the display area has more even electrical property. The TFT substrate, therefore, has better quality.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A method of forming a low temperature poly-Si (LTPS) thin-film transistor (TFT) substrate, comprising:

Step 1: providing a substrate and depositing a buffer layer on the substrate;
    Step 2: depositing and patterning an a-Si layer on the buffer layer, so to get a first a-Si region in the display area and a second a-Si region in the drive area, with the two regions arrayed with a space in between;
    Step 3: depositing a silicon oxide layer on the first a-Si region and the second a-Si region, and patterning the silicon oxide layer through lithography and etching process, so to form a silicon oxide layer in the display area;
    Step 4: taking the silicon oxide layer as a photomask and annealing the first a-Si region and the second a-Si region with excimer laser, so that they crystallize and turn into poly-Si regions;
    Step 5: removing the silicon oxide layer and forming the first poly-Si region in the display area and the second poly-Si region in the drive area, with the two regions arrayed with a space in between;
    Step 6: defining a heavily N-doped area and a lightly N-doped area on the first and second poly-Si regions respectively, and implanting different dosages of P31 into the heavily N-doped area and the lightly N-doped area, so to form a lightly doped drain (LDD) area;
    Step 7: depositing and patterning a gate insulating layer on the buffer layer, the first and the second poly-Si regions;
    Step 8: depositing a first metal layer on the gate insulating layer, and patterning the metal layer to form a first gate and a second gate corresponding to the first and the second poly-Si regions respectively;
    Step 9: forming an interlayer dielectric layer on the gate insulating layer, and forming via holes leading to the heavily N-doped areas next to the first and second poly-Si regions through the gate insulating layer and the interlayer dielectric layer;
    Step 10: depositing and patterning a second metal layer on the interlayer dielectric layer, and forming a first source/drain and a second source/drain, with the first source/drain and the second source/drain connecting to the heavily N-doped areas next to the first and second poly-Si regions through the via hole.

2. The method of claim 1, wherein materials of the buffer layer are either silicon nitride, silicon oxide, or the combination of both.

3. The method of claim 1, wherein materials of the interlayer dielectric layer are either silicon oxide, silicon nitride, or the combination of both.

4. The method of claim 1, wherein each of the first gate and the second gate is a single layer or stacked layers, and each layer is made of a material selected from molybdenum, titanium, aluminum, or copper.

5. The method of claim 1, wherein in the Step 6, the heavily N-doped area and the lightly N-doped area are defined by applying lithographic photoresist and two photomasks respectively, and lightly doped drain areas are produced by implanting different dosages of P31 in the heavily N-doped area and lightly N-doped area.

6. The method of claim 1, wherein the gate insulating layer, the first gate, the second gate, the via hole, the first source/drain and the second source/drain are formed through deposition, lithography and etching process.

* * * * *